United States Patent [19]

Skudera, Jr.

[11] Patent Number: 5,536,989
[45] Date of Patent: Jul. 16, 1996

[54] CIRCUIT ARRANGEMENT FOR SAW SUBSTRATES

[75] Inventor: William J. Skudera, Jr., Oceanport, N.J.

[73] Assignee: The United States of America as represented by the Secretary of the Army, Washington, D.C.

[21] Appl. No.: 412,257

[22] Filed: Mar. 28, 1995

[51] Int. Cl.$^6$ .................................................. H01L 41/08
[52] U.S. Cl. ................................. 310/313 R; 310/313 B
[58] Field of Search .......................... 310/313 R, 313 B, 310/313 C, 313 D; 333/150–154, 195–196

[56] References Cited

U.S. PATENT DOCUMENTS

| | | | |
|---|---|---|---|
| 3,446,974 | 5/1969 | Seiwatz | 310/313 B X |
| 3,903,486 | 9/1975 | Bert et al. | 310/313 B X |
| 3,909,753 | 9/1975 | Burrow | 310/313 B X |
| 3,961,290 | 6/1976 | Moore | 310/313 B X |
| 4,016,514 | 4/1977 | Reeder et al. | 310/313 B X |
| 4,021,761 | 5/1977 | Morii et al. | 310/313 B X |
| 4,575,653 | 3/1986 | Sinha | 310/313 B |
| 5,115,160 | 5/1992 | Knoll et al. | 310/313 B |
| 5,243,249 | 9/1993 | Miyashita et al. | 310/313 B |
| 5,309,126 | 5/1994 | Allen | 310/313 B X |

*Primary Examiner*—Mark O. Budd
*Attorney, Agent, or Firm*—Michael Zelenka; John M. O'Meara

[57] ABSTRACT

A SAW substrate is disclosed which can be adapted to a particular signal in a multitude of signal possibilities. Each signal adaptation is made by connecting alternate electrodes of sequential tap transducers to either a positive bus or a negative bus, through auxiliary buses. A pair of the auxiliary buses is dedicated to each tap transducer, with one auxiliary bus in each pair being disposed adjacent to the positive bus and the other auxiliary bus in each pair being disposed adjacent to the negative bus. A pad is associated with each auxiliary bus for locating it adjacent to the positive bus or the negative bus which is not otherwise adjacent thereto. When a large number of signal possibilities are necessary, an unreasonably lengthy substrate is avoided by aligning the tap transducers in parallel channels across the substrate.

7 Claims, 2 Drawing Sheets

CIRCUIT ARRANGEMENT FOR SAW SUBSTRATES

GOVERNMENT INTEREST

The invention described herein may be manufactured, used, and licensed by or for the United States Government for governmental purposes without payment to me of any royalties thereon.

BACKGROUND OF THE INVENTION

The present invention relates to SAW (surface acoustic wave) substrates, and more particularly to such a substrate which is adaptable to any one signal in a multitude of signal possibilities.

SAW substrates are well known in the art. Sync and tap transducers are disposed on each SAW substrate along with positive and negative buses. Each transducer includes at least two electrodes which extend across the substrate between the busses with each electrode being connected to one of the busses. The substrates are fabricated of a piezoelectric material and have a metal clad surface on which the pattern of electrodes and busses is etched, after being deposited thereon using a mask.

Many SAW systems utilize only one signal and consequently, all of the substrates for such systems can be fabricated with a single mask. However, other SAW systems are possible wherein several different signals are utilized, such as is disclosed and claimed in my application entitled RECOGNITION TAG FOR USE IN A SYSTEM FOR IDENTIFYING DISTANT ITEMS which was filed in the USPTO on Nov. 28, 1994 and was assigned Ser. No. 08/346,594. Of course, the SAW substrate relating to each different signal would require a separate mask and consequently many different masks would be required for such systems.

SUMMARY OF THE INVENTION

It is the general object of the present invention to provide a SAW substrate which is adaptable to any one signal in a multitude of signal possibilities.

It is a specific object of the present invention to accomplish the general object with reduced acoustic reflection.

It is another specific object of the present invention to accomplish the general object for a large number of signal possibilities without unreasonably extending the length of the SAW substrate.

To accomplish these and other objects in accordance with the present invention, the electrodes of each tap transducer are disposed between a pair of auxiliary buses, with a positive bus located adjacent to one auxiliary bus in each pair and a negative bus located adjacent to the other auxiliary bus in each pair. The electrodes in each tap transducer alternately connect to the auxiliary buses thereof and a pad having a transitional conductor extending therefrom is utilized for disposing each auxiliary bus adjacent to the positive bus or the negative bus which is not otherwise adjacent thereto. When reduced acoustic reflection is desired, the transitional conductors are extended at an angle relative to the electrodes. To accommodate a large number of signal possibilities, the tap transducers are aligned in parallel channels, with the positive and/or negative buses disposed between and shared by adjoining channels.

The scope of the present invention is only limited by the appended claims for which support is predicated on the preferred embodiments set forth hereafter in the following description and the attached drawings wherein like reference characters relate to like parts throughout the Figures.

DESCRIPTION OF THE PREFERRED EMBODIMENTS

Figure 1:
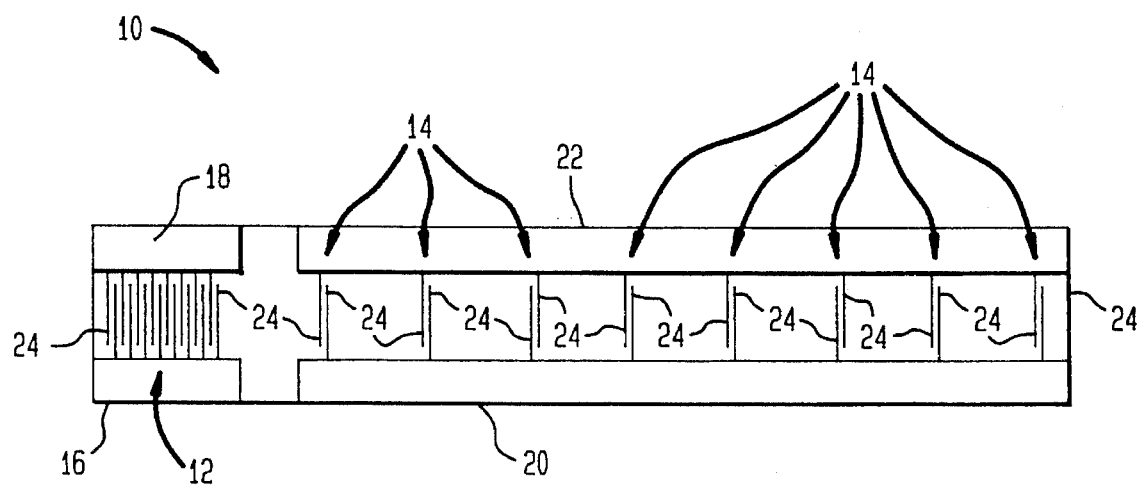
FIG. 1 illustrates a prior art SAW substrate for a particular signal.

As shown in FIG. 1, SAW substrates 10 for tapped delay line applications conventionally include a sync transducer 12 which aligns with a plurality of tap transducers 14. Positive and negative buses are disposed on the substrate 10 for each type of transducer, with the sync transducer 12 having positive bus 16 and negative bus 18 and the tap transducers 14 having positive bus 20 and negative bus 22. The positive bus 20 extends along one side of the tap transducers 14, while the negative bus 22 extends along the other side of the tap transducers 14. Groups of at least two parallel electrodes 24 extend across the substrate 10 relative to each transducer 12 and 14, with the electrodes 24 in each tap transducer 14 being alternately connected to the positive and negative buses 20 and 22, in accordance with the signal to which the substrate 10 applies. Usually the electrodes 24 of the sync transducer 12 are electrically actuated by the buses 16 and 18 to generate a SAW in the substrate 10, which propagates therethrough to electrically actuate the electrodes 24 of the tap transducers 14. As is well known by those skilled in the art of SAW devices, each substrate 10 relates to a particular signal in accordance with the pattern of positively and negatively connected electrodes 24 in the tap transducers 14 thereof. This pattern is fixed by a mask during a conventional photoetch process which is utilized to fabricate each substrate 10. Consequently, a plurality of masks are necessary when a plurality of SAW substrates are required which each relates to a different signal, such as in the system for identifying distant items that is disclosed in my aforementioned patent application. SAW devices are commonly utilized in regard to biphase coded (hereinafter BPC) signals but are not limited to such signals.

Figure 2:
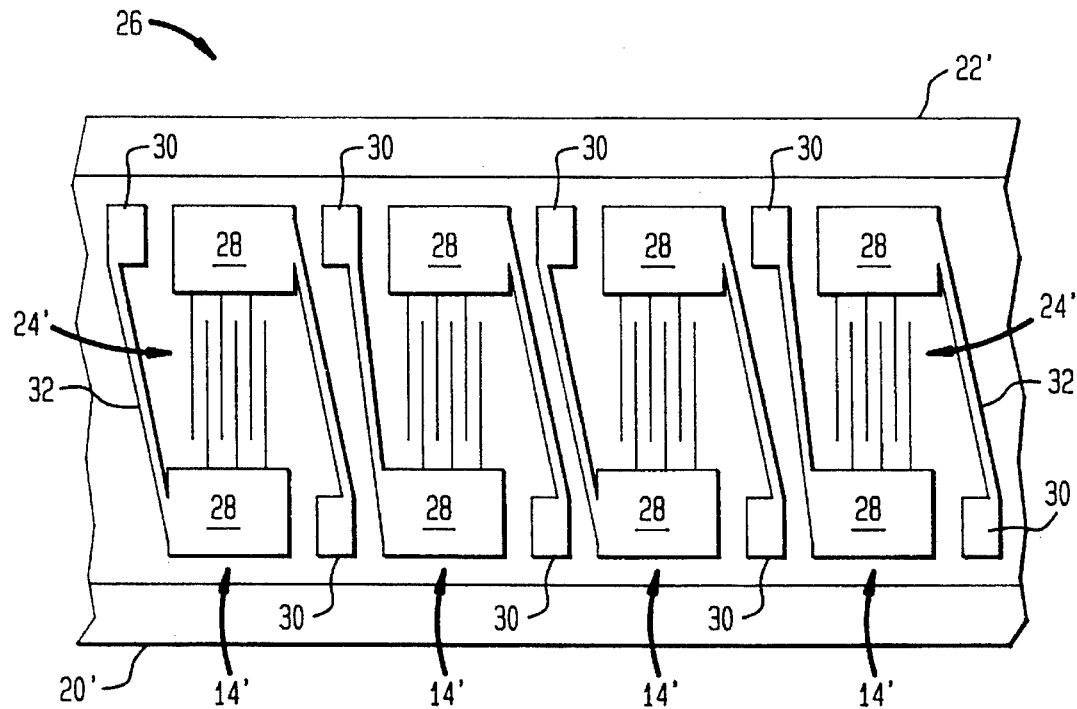
FIG. 2 relates to one preferred SAW substrate circuit arrangement of the invention.

The invention relates to a SAW substrate circuit arrangement, regarding which a representative portion of the tap transducer section only, is shown on a SAW substrate blank 26 in FIG. 2. Each tap transducer 14' includes a pair of auxiliary buses 28 which are disposed on the blank 26 with a group of at least two electrodes 24' extending therebetween that are alternately connected to only one of the auxiliary buses 28. A positive bus 20' is disposed adjacent to one auxiliary bus 28 in each pair and a negative bus 22' is disposed adjacent to the other auxiliary bus 28 in each pair. Pad means 30 is also included on the blank 26 for locating each auxiliary bus 28 adjacent to the positive bus 20' or negative bus 22' that is not otherwise adjacent thereto. Relative to each auxiliary bus 28, the pad means 30 includes a transitional conductor 32 which in FIG. 2, extends from the auxiliary buses 28. However, each transitional conductor 32 could also extend from the positive bus 20 or the negative bus 22' to which it relates. Furthermore, the transitional conductors 32 in FIG. 2 extend at an angle relative to the electrodes 24', so that acoustic reflections are reduced. However, the transitional conductors 32 could also extend parallel to the electrodes 24' when acoustic reflections are not a consideration.

Figure 3:
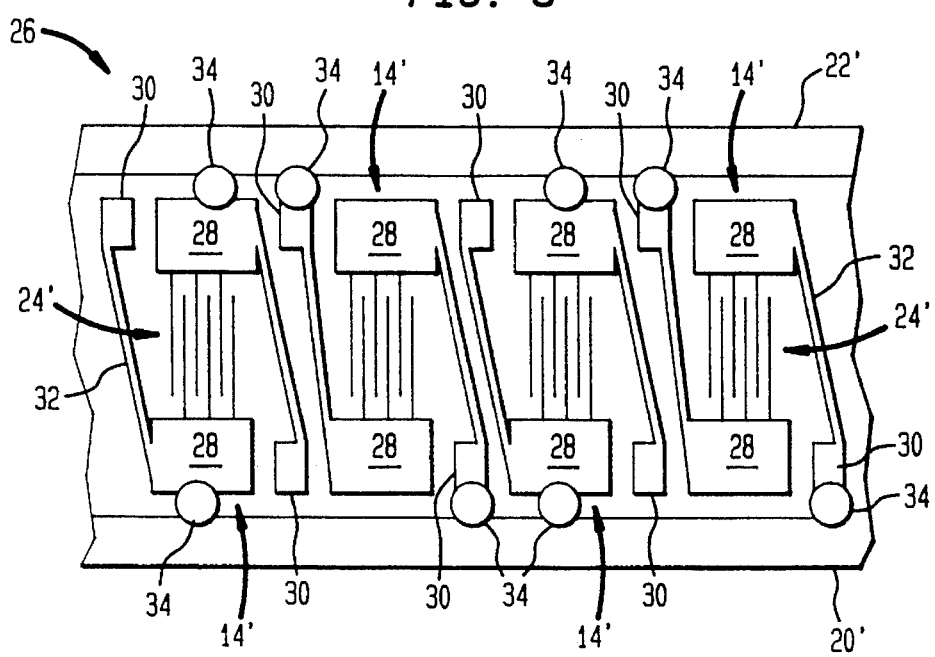
FIG. 3 illustrates how the FIG. 2 SAW substrate circuit arrangement is adapted to a particular signal.

The substrate blank 26 of the invention is adaptable to any one signal in a multitude of signal possibilities. As those skilled in the art of SAW devices will understand without any further explanation, the actual number of signal possibilities depends on the number (n) of tap transducers 14' that are available on the blank 26, and equals two to the n power, minus one. For each signal possibility, the auxiliary buses 28 of the tap transducers 14' must each be connected to either the positive bus 20' or the negative bus 22' in a particular sequence. As shown with circular interconnects 34 in FIG. 3, such connections are made directly between the auxiliary buses 28 and the positive bus 20' or negative bus 22' adjacent thereto, but through the pad means 30 when the auxiliary buses 28 and the positive bus 20' or negative bus 22' are not otherwise adjacent.

Figure 4:
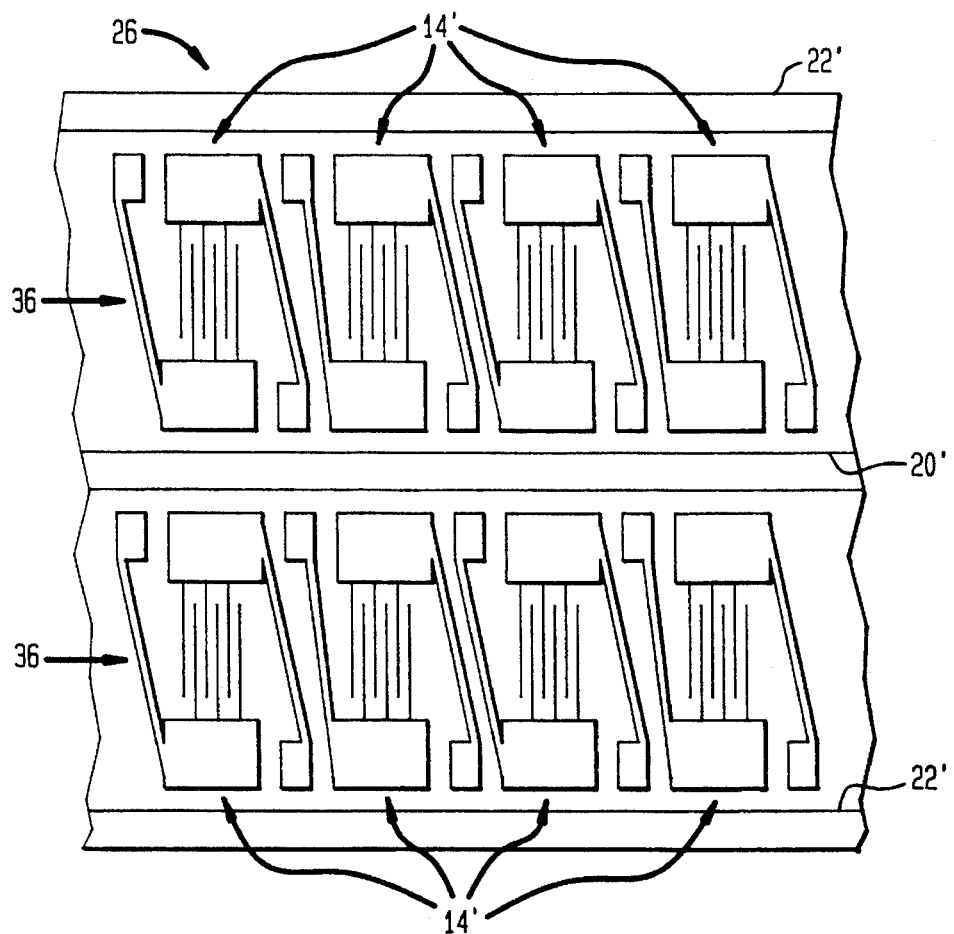
FIG. 4 relates to another preferred SAW substrate circuit arrangement of the invention.

Of course, the length of the substrate blank 26 in FIG. 2 will increase proportionately as the number of tap transducers 14' increases. This proportionate length increase can be substantially ameliorated as shown in FIG. 4, where the tap transducers 14' are disposed in a plurality of channels 36 which are aligned in parallel across the width of the blank 26. The positive bus 20' is disposed between the parallel channels 36 of tap transducers 14' and is shared by those transducers 14'. However, only two parallel channels 36 of tap transducers 14' are included in FIG. 4. If another parallel channel 36 were included in FIG. 4, the negative bus 22' would then be disposed between and shared by that channel and one of the two channels shown therein.

Those skilled in the art will appreciate without any further explanation that within the concept of this invention many modifications and variations are possible to the above disclosed embodiments of the SAW substrate blank 26. Consequently, it should be understood that all such variations and modifications fall within the scope of the following claims.

What I claim is:

1. On a SAW substrate having sequential groups of at least two parallel electrodes extending thereacross and each group serves as a tap transducer when the electrodes thereof are alternately connected to either a positive bus that extends along one side of the transducers or a negative bus that extends along the other side of the transducers, the improvement comprising:

pairs of auxiliary buses, each pair having one group of electrodes extending therebetween with each electrode connected to only one auxiliary bus in that pair, and the positive bus is disposed adjacent to one auxiliary bus in each pair while the negative bus is disposed adjacent to the other auxiliary bus in each pair; and pad means for locating each auxiliary bus adjacent to the positive bus or negative bus not otherwise adjacent thereto, with the substrate being thereby adaptable to select a particular coded signal from a multitude of coded signal possibilities by selectively connecting each auxiliary bus to the positive bus or negative bus either directly or through the pad means.

2. The substrate of claim 1 wherein each pad means includes a transitional conductor which extends from the auxiliary bus to which that pad means relates.

3. The substrate of claim 2 wherein acoustic reflection is reduced by extending the transitional conductors at an angle relative to the electrodes, 4. The substrate of claim 1 wherein each pad means includes a transitional conductor which extends from the positive bus or negative bus to which the pad means relates.

5. The substrate of claim 4 wherein acoustic reflection is reduced by extending the transitional conductors at an angle relative to the electrodes, 6. The substrate of claim 1 wherein the tap transducers are aligned in series thereon.

7. The substrate of claim 1 wherein the tap transducers are disposed in a plurality of channels which are aligned in parallel across the width of the substrate.

\* \* \* \* \*